United States Patent
Yeh et al.

(10) Patent No.: US 9,362,245 B2
(45) Date of Patent: Jun. 7, 2016

(54) PACKAGE STRUCTURE AND FABRICATION METHOD THEREOF

(71) Applicants: Chun-Wei Yeh, Tantzu (TW); Chun-Hsien Shen, Taichung Hsien (TW); Hsiu-Jung Li, Taichung Hsien (TW); Ya-Yi Lai, Taichung Hsien (TW); Fu-Tang Huang, Taichung (TW)

(72) Inventors: Chun-Wei Yeh, Tantzu (TW); Chun-Hsien Shen, Taichung Hsien (TW); Hsiu-Jung Li, Taichung Hsien (TW); Ya-Yi Lai, Taichung Hsien (TW); Fu-Tang Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 42 days.

(21) Appl. No.: 13/971,237

(22) Filed: Aug. 20, 2013

(65) Prior Publication Data

US 2014/0327131 A1 Nov. 6, 2014

(30) Foreign Application Priority Data

May 1, 2013 (TW) .............................. 102115571 A

(51) Int. Cl.
*H01L 23/48* (2006.01)
*H01L 23/00* (2006.01)
(Continued)

(52) U.S. Cl.
CPC ............ *H01L 24/13* (2013.01); *H01L 23/3114* (2013.01); *H01L 23/562* (2013.01);
(Continued)

(58) Field of Classification Search
CPC .................. H01L 2224/023–2224/0239; H01L 2224/05008; H01L 2224/05024; H01L 2224/05548; H01L 2224/05569; H01L 2224/06137–2224/06139; H01L 2224/06147–2224/06149; H01L 2224/06157–2224/06159; H01L 2224/06167–2224/06169; H01L 2224/06182; H01L 2224/06187–2224/06189; H01L 2224/13008; H01L 2224/13024; H01L 2224/29008; H01L 2224/29024; H01L 2225/06527; H01L 2225/1041; H01L 24/11; H01L 24/13; H01L 2224/0345; H01L 2224/03462; H01L 2224/05572; H01L 2224/11849; H01L 2224/131; H01L 2224/02351; H01L 2224/02375; H01L 2224/0401; H01L 2224/05009; H01L 2224/05022; H01L 2224/1134; H01L 2224/13006; H01L 2924/00014; H01L 2924/351; H01L 2924/00; H01L 2924/00012; H01L 2924/014; H01L 23/3114; H01L 23/3192; H01L 23/525; H01L 23/562; H01L 24/05; C07C 51/15; C07C 51/15

USPC ......... 257/734, 753, 773, 775, 776, 786, 737, 257/778; 438/614

See application file for complete search history.

(56) References Cited

U.S. PATENT DOCUMENTS 6,249,013 B1 * 6/2001 Hirose .......................... 257/208
6,744,067 B1 * 6/2004 Farnworth et al. ............... 257/48
(Continued)

*Primary Examiner* — Teresa M Arroyo
(74) *Attorney, Agent, or Firm* — Mintz Levin Cohn Ferris Glovsky and Popeo, P.C.; Peter F. Corless; Steven M. Jensen

(57) ABSTRACT

A package structure is disclosed, which includes a substrate having a body, a plurality of conductive pads formed on the body and a surface passivation layer formed on the body and having a plurality of openings for exposing the conductive pads; a plurality of conductive vias formed in the openings of the surface passivation layer and electrically connected to the conductive pads; a plurality of circuits formed on the surface passivation layer and electrically connected to the conductive vias, wherein the circuits have a plurality of electrical contacts; at least a pattern portion formed on the surface passivation layer and intersecting with the circuits; and a second passivation layer formed on the surface passivation layer, the circuits and the pattern portion and having a plurality of openings for exposing portions of the electrical contacts of the circuits, thereby strengthening the bonding between the circuits and the passivation layers.

10 Claims, 4 Drawing Sheets

(51) Int. Cl.
*H01L 23/31* (2006.01)
*H01L 23/525* (2006.01)

(52) U.S. Cl.
CPC ............ *H01L 24/05* (2013.01); *H01L 23/3192* (2013.01); *H01L 23/525* (2013.01); *H01L 2224/02351* (2013.01); *H01L 2224/02375* (2013.01); *H01L 2224/0345* (2013.01); *H01L 2224/03462* (2013.01); *H01L 2224/0401* (2013.01); *H01L 2224/05008* (2013.01); *H01L 2224/05009* (2013.01); *H01L 2224/05022* (2013.01); *H01L 2224/05569* (2013.01); *H01L 2224/05572* (2013.01); *H01L 2224/1134* (2013.01); *H01L 2224/11849* (2013.01); *H01L 2224/131* (2013.01); *H01L 2224/13006* (2013.01); *H01L 2924/351* (2013.01)

(56) References Cited

U.S. PATENT DOCUMENTS

| | | | |
|---|---|---|---|
| 2005/0110154 A1* | 5/2005 | Komiya | 257/773 |
| 2006/0022350 A1* | 2/2006 | Watkins | 257/779 |
| 2007/0176240 A1* | 8/2007 | Chung et al. | 257/355 |
| 2008/0217769 A1* | 9/2008 | Yanase et al. | 257/737 |
| 2009/0051030 A1* | 2/2009 | Yang et al. | 257/738 |
| 2009/0212428 A1* | 8/2009 | Yang et al. | 257/738 |
| 2012/0146231 A1* | 6/2012 | Meyer et al. | 257/773 |
| 2013/0127052 A1* | 5/2013 | Tu et al. | 257/738 |

* cited by examiner

PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 102115571, filed May 1, 2013, the entire contents of which is incorporated herein by reference.

BACKGROUND OF THE INVENTION

1. Field of the Invention

The present invention relates to package structures and fabrication methods thereof, and more particularly, to a package structure having a redistribution layer and a fabrication method thereof.

2. Description of Related Art

A redistribution layer changes original locations of I/O pads of a chip through wafer-level wiring and bumping processes so as to provide a preferred circuit configuration, thereby achieving a package structure having good electrical properties and good bonding strength.

FIG. 1A is a schematic cross-sectional view of a conventional package structure having a redistribution layer and FIG. 1B is a schematic upper view of the package structure. It should be noted that FIG. 1B only shows a portion of the redistribution layer of the package structure and omits conductive bumps 140.

Referring to FIGS. 1A and 1B, a packaging substrate is provided, which has a body 100 and a plurality of conductive pads 112 formed on the body 100. A surface passivation layer 110 is formed on the body 100 and a plurality of openings 114 are formed in the surface passivation layer 110 for exposing the conductive pads 112. Then, a second passivation layer 120 is formed on the surface passivation layer 110 and the conductive pads 112, and a plurality of first openings 122 are formed in the second passivation layer 120 for exposing the conductive pads 112. Thereafter, a plurality of conductive vias 124 are formed in the first openings 122 of the second passivation layer 120, and a plurality of circuits 126 are formed on the second passivation layer 120 and electrically connected to the conductive vias 124. Therein, the circuits 126 have a plurality of electrical contacts 128 formed at ends thereof. Then, a first passivation layer 130 is formed on the second passivation layer 120, the circuits 126 and the electrical contacts 128, and a plurality of openings 132 are formed in the first passivation layer 130 for exposing the electrical contacts 128. Thereafter, a plurality of conductive elements 134 are formed in the openings 132 of the first passivation layer 130 and electrically connected to the electrical contacts 128. Subsequently, a plurality of conductive bumps 140 are formed on the conductive elements 134.

However, along with the multifunctional development of chips, to meet a greatly increased number of electrical contacts along with special requirements on resistors, inductors and capacitors, the redistribution layer is generally configured to have fine circuits that have a width less than 25 um. As such, during a chip bonding process, the circuits easily delaminate due to concentration of stresses on small contact areas between the circuits and the passivation layers. Further, in operation, the circuits may crack due to thermal stresses caused by temperature variations.

Therefore, how to overcome the above-described drawbacks has become urgent.

SUMMARY OF THE INVENTION

In view of the above-described drawbacks, the present invention provides a package structure, which comprises: a substrate comprising a body, a plurality of conductive pads formed on the body and a surface passivation layer formed on the body and the conductive pads and having a plurality of openings for exposing the conductive pads; a plurality of conductive vias formed in the openings of the surface passivation layer and electrically connected to the conductive pads; a plurality of circuits formed on the surface passivation layer and electrically connected to the conductive vias, wherein the circuits have a plurality of electrical contacts; at least a pattern portion formed on the surface passivation layer and intersecting with the circuits; and a first passivation layer formed on the surface passivation layer, the circuits and the pattern portion and having a plurality of openings for exposing portions of the electrical contacts of the circuits.

The present invention further provides a fabrication method of a package structure, which comprises the steps of providing a substrate comprising a body, a plurality of conductive pads formed on the body and a surface passivation layer formed on the body and the conductive pads and having a plurality of openings for exposing the conductive pads; forming a second passivation layer on the surface passivation layer and the conductive pads; forming in the second passivation layer a plurality of first openings corresponding in position to the conductive pads for exposing portions of the conductive pads and a plurality of second openings at positions other than the positions of the conductive pads for penetrating the second passivation layer; forming on the second passivation layer a plurality of circuits and at least a pattern portion intersecting with the circuits, forming a plurality of conductive vias in the first openings of the second passivation layer for electrically connecting the conductive pads and the circuits, and forming in the second openings a plurality of fixing portions connected to the pattern portion, wherein the circuits have a plurality of electrical contacts; and forming a first passivation layer on the second passivation layer, the circuits and the pattern portion and forming a plurality of openings in the first passivation layer for exposing portions of the electrical contacts of the circuits.

In an embodiment, the circuits further have at least a bending portion.

Therefore, by forming the pattern portion as well as the fixing portions and the bending portion, the present invention strengthens the bonding between the circuits and the passivation layers.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "on", "first", "second" etc, are merely for illustrative purposes and should not be construed to limit the scope of the present invention.

Figure 1A:
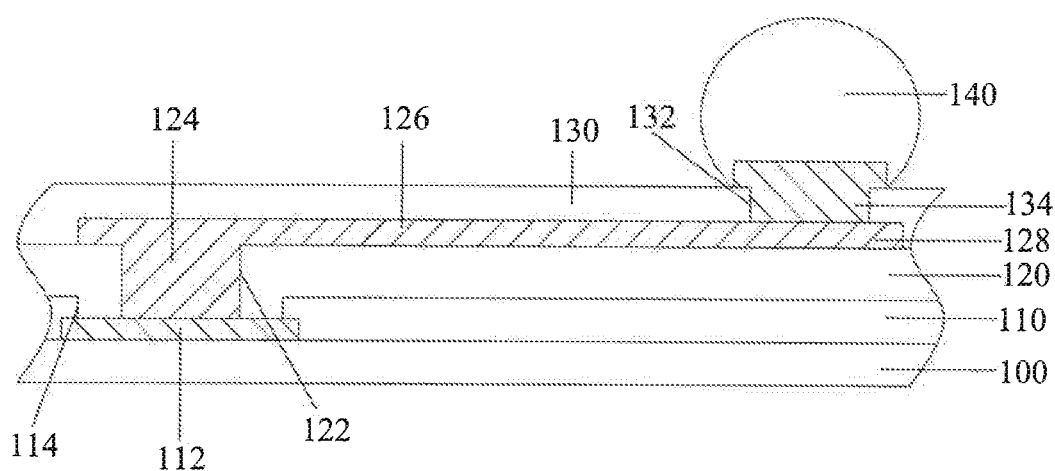
FIGS. 1A and 1B are schematic cross-sectional and upper views of a conventional package structure.
Figure 1B:
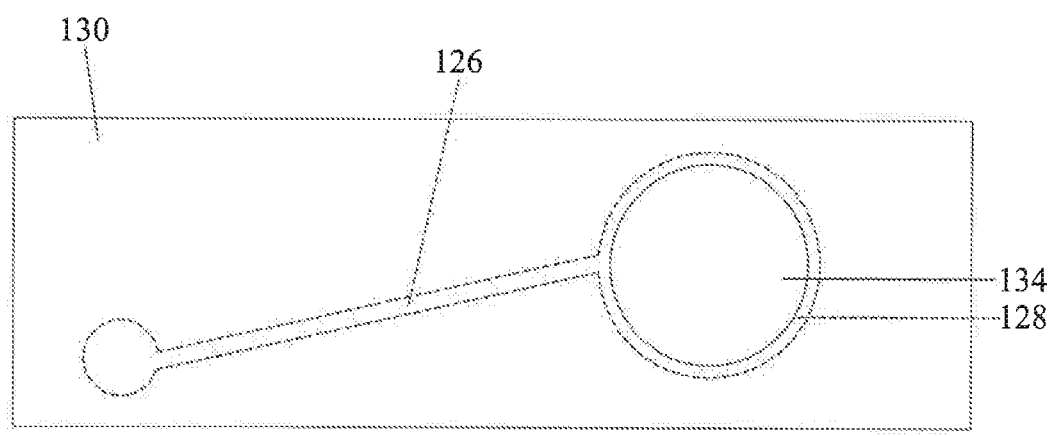
Figure 2A:
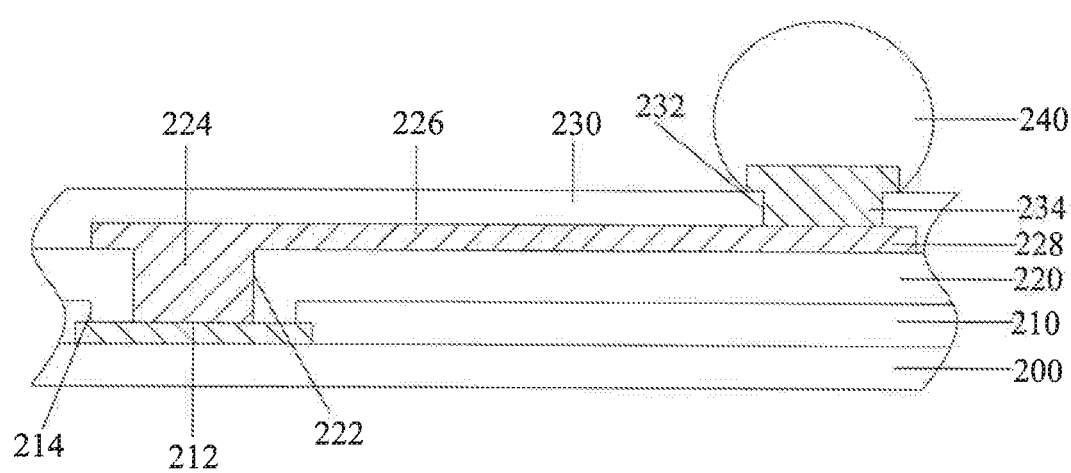
FIGS. 2A and 2B are schematic cross-sectional and upper views of a package structure according to a first embodiment of the present invention.
Figure 2B:
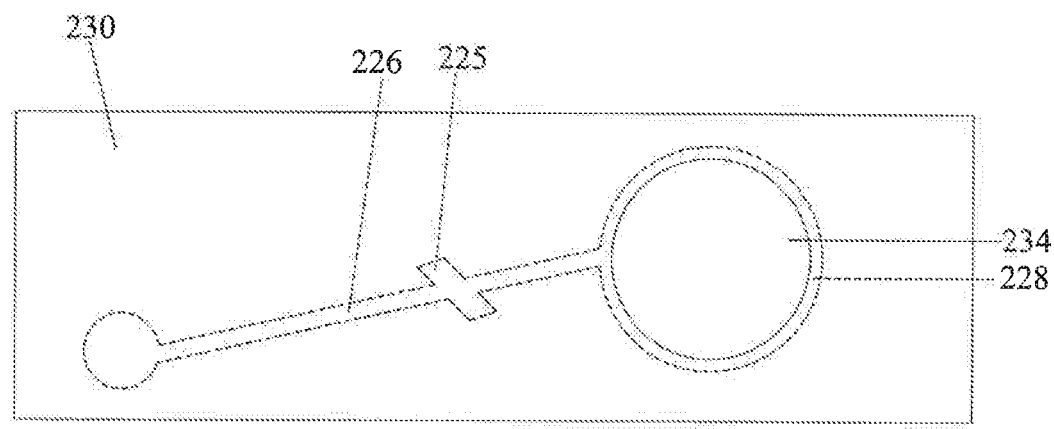

FIGS. 2A and 2B are schematic cross-sectional and upper views of a package structure according to a first embodiment of the present invention. Therein, FIG. 2B only shows a portion of the redistribution layer and omits the conductive bumps 240

Referring to FIGS. 2A and 2B, a substrate is provided, which has a body 200, a plurality of conductive pads 212 formed on the body 200, and a surface passivation layer 210 formed on the body 200 and the conductive pads 212 and having a plurality of openings 214 for exposing the conductive pads 212. For simplification purposes, only one conductive pad 212 is shown in the drawings.

The body 200 can be a wafer, a chip or any other electronic element or semiconductor element having conductive pads formed thereon. The openings 214 of the surface passivation layer 210 can be formed by photoresist coating, developing and etching.

Then, a second passivation layer 220 is formed on the surface passivation layer 210 and the conductive pads 212. The second passivation layer 220 can be made of polyimide (PI) or polybenzoxazole (PBO). A plurality of first openings 222 are formed in the second passivation layer 220 by photoresist coating, developing and etching for exposing the conductive pads 212. Thereafter, by performing an electroplating or sputtering process, a plurality of conductive vias 224 are formed in the first openings 222 and electrically connected to the conductive pads 212.

Further, by performing sputtering, photoresist coating and developing and etching, a plurality of circuits 226 (such as a redistribution layer) are formed on the second passivation layer 220 and electrically connected to the conductive vias 224. The circuits 226 have a plurality of electrical contacts 228 formed at ends thereof. Furthermore, at least a pattern portion 225 is formed on the second passivation layer 220 and intersects with the circuits 226 at any angle so as to substantially increase the area of the circuits 226 and strengthen the bonding between the circuits 226 and the second passivation layer 220. There is no limitation on the size and shape of the pattern portion 225. Preferably, the pattern portion 225 is of a line shape with a width of 25 um and a length of 50 um. The pattern portion 225 can be equal in width to the circuits 226. Then, a first passivation layer 230 is formed on the second passivation layer 220, the circuits 226 and the pattern portion 225. The first passivation layer 230 can be made of polyimide (PI) or polybenzoxazole (PBO). A plurality of openings 232 are formed in the first passivation layer 230 by photoresist coating, developing and etching for exposing the electrical contacts 228. Thereafter, a plurality of conductive elements 234 made of such as UBM (under bump metallurgy) layers are formed in the openings 232 by electroplating or sputtering so as to be electrically connected to the electrical contacts 228. Subsequently, a plurality of conductive bumps 240 are formed on the conductive elements 234 by reflowing a solder material deposited on the conductive elements 234.

Therefore, the present invention increases the contact area between the circuits and the passivation layers without increasing the width of the circuits on as to strengthen the bonding between the circuits and the passivation layers.

In another embodiment, the circuits 226 can be directly formed on the surface passivation layer 210 instead of the second passivation layer 220.

Figure 3:
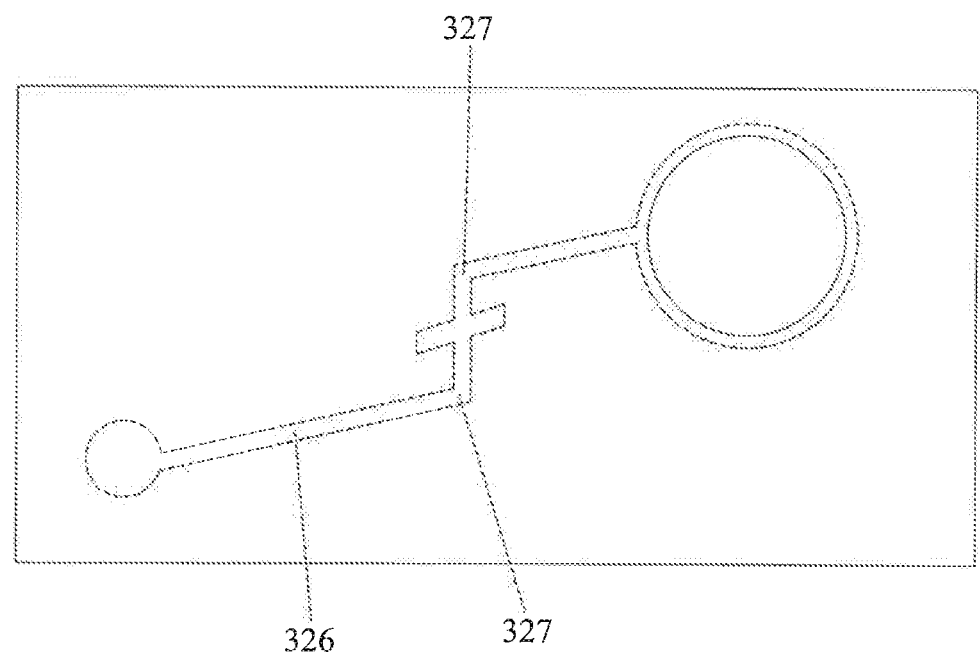
FIG. 3 is a schematic upper view of a package structure according to a second embodiment of the present invention.

FIG. 3 shows a package structure according to a second embodiment of the present invention.

The present embodiment differs from the first embodiment in that the circuits 326 further have at least a bending portion 327 so as to facilitate release of thermal stresses caused by temperature variations, thereby preventing cracking of the circuits 326. The bending portion 327 can be bent at any angle relative to the circuits 326.

Figure 4A:
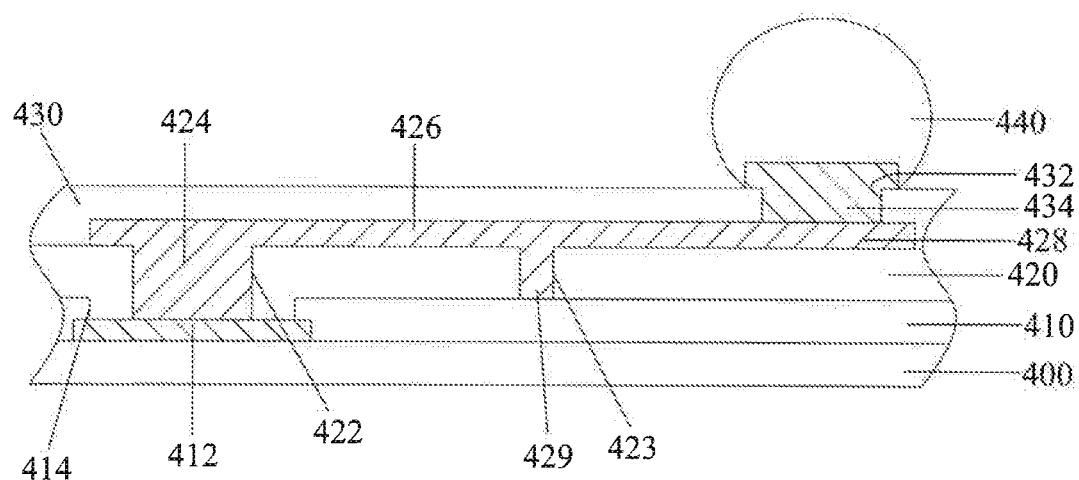
FIGS. 4A and 4B are schematic cross-sectional and upper views of a package structure according to a third embodiment of the present invention.
Figure 4B:
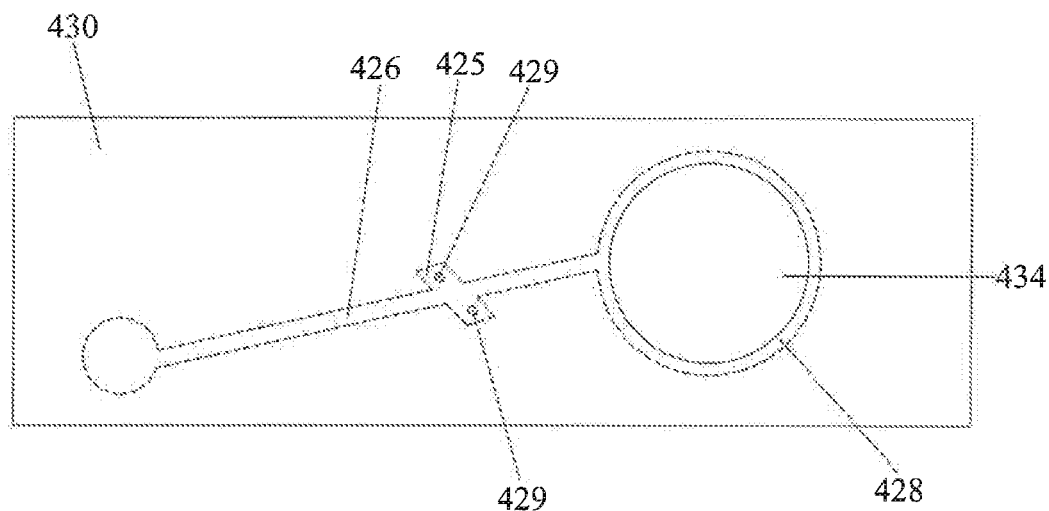

FIG. 4A is a schematic cross-sectional view of a package structure according to a third embodiment of the present invention, and FIG. 4B is a schematic upper view of the package structure. Therein, FIG. 4B only shows a portion of the redistribution layer and omits the conductive bumps 440.

The present embodiment differs from the first embodiment in that when the first openings 422 are formed in the second passivation layer 420, a plurality of second openings 423 are formed in the second passivation layer 420 corresponding in position to the predefined pattern portion 425. The second openings 423 partially overlap the pattern portion 425 or are located at ends of the pattern portion 425. The second openings 423 are not in contact with the conductive pads 412.

Then, a plurality of fixing portions 429 are formed in the second openings 423 and embedded in the second passivation layer 420. For example, the fixing portions 429 penetrate the second passivation layer 420 and are not in contact with the conductive pads 412. Therefore, the bonding between the circuits 426 and the second passivation layer 420 is strengthened by the fixing portions 429 that are formed in the second passivation layer 420 and connected to the pattern portion 425.

The present invention further provides a method for fabricating the package structure of FIGS. 4A and 4B, which includes the steps of: providing a substrate having a body 400, a plurality of conductive pads 412 formed on the body and a surface passivation layer 410 formed on the body 400 and the conductive pads 412 and having a plurality of openings 414 for exposing the conductive pads 412; forming a second passivation layer 420 on the surface passivation layer 410 and the conductive pads 412, and performing photoresist coating, developing and etching processes so as to form in the second passivation layer 420 a plurality of first openings 422 corresponding in position to the conductive pads 412 for exposing the conductive pads 412 and a plurality of second openings 423 at positions other than the conductive pads 412 for penetrating the second passivation layer 420; forming a plurality of conductive vias 424 in the first openings 422 and a plurality of fixing portions 429 in the second openings 423, forming a plurality of circuits 426 electrically connected to the conductive vias 424, and forming at least a pattern portion 425 connected to the fixing portions 429 and intersecting with the circuits 426, wherein the circuits 426 have a plurality of electrical contacts 428 formed at ends thereof and the fixing portions 429 are located at ends of the pattern portion 425; forming a first passivation layer 430 on the second passivation layer 420, the circuits 426 and the pattern portions 425 and performing photoresist coating, photolithography and etching processes to form a plurality of openings 432 in the first passivation layer 430 for exposing the electrical contacts 428;

performing an electroplating process or a sputtering process to form in the openings 432 a plurality of conductive elements 434 such as UBM layers that are electrically connected to the electrical contacts 428; and forming a plurality of conductive bumps 440 on the conductive elements 434 by reflowing a solder material deposited on the conductive elements 440.

Therefore, by forming the pattern portion as well as the fixing portions and the bending portion, the present invention strengthens the bonding between the circuits and the passivation layers so as to prevent cracking of the circuits.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package structure, comprising:
   a substrate, comprising:
   a body;
   a plurality of conductive pads formed on the body; and
   a surface passivation layer formed on the body and the conductive pads and having a plurality of openings for exposing the conductive pads;
   a plurality of conductive vias formed in the openings of the surface passivation layer and electrically connected to the conductive pads;
   a plurality of circuits formed on the surface passivation layer and electrically connected to the conductive vias, wherein the circuits have a plurality of electrical contacts;
   at least a pattern portion formed on the surface passivation layer and intersecting with the circuits, wherein the pattern portion is of a line shape free from connecting any of the conductive pads and the electrical contacts, and wherein a length of the pattern portion is smaller than a length of each of the circuits; and
   a first passivation layer formed on the surface passivation layer, the circuits and the pattern portion and having a plurality of openings for exposing portions of the electrical contacts of the circuits.

2. The structure of claim 1, further comprising a second passivation layer formed on the surface passivation layer and the conductive pads and having a plurality of openings for exposing portions of the conductive pads, and the second passivation layer is sandwiched between the surface passivation layer and the circuits.

3. The structure of claim 1, further comprising a plurality of conductive elements formed in the openings of the first passivation layer and electrically connected to the electrical contacts.

4. The structure of claim 3, wherein the conductive elements are made of under bump metallurgy (UBM) layers.

5. The structure of claim 3, further comprising a plurality of conductive bumps formed on the conductive elements.

6. The structure of claim 1, wherein the line is equal in width to the circuits.

7. The structure of claim 1, wherein the circuits have at least a bending portion.

8. The structure of claim 2, further comprising a plurality of fixing portions connected to the pattern portion and embedded in the second passivation layer.

9. The structure of claim 8, wherein the fixing portions are located at ends of the pattern portion.

10. The structure of claim 1, wherein the pattern portion has a width of 25 um and the length of 50 um.

* * * * *